(12) United States Patent
Eguchi

(10) Patent No.: US 8,361,874 B2
(45) Date of Patent: Jan. 29, 2013

(54) METHOD OF MANUFACTURING SEMICONDUCTOR DEVICE

(75) Inventor: Akira Eguchi, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 155 days.

(21) Appl. No.: 13/072,961

(22) Filed: Mar. 28, 2011

(65) Prior Publication Data

US 2011/0287594 A1 Nov. 24, 2011

(30) Foreign Application Priority Data

May 21, 2010 (JP) .................................. 2010-117333

(51) Int. Cl.
*H01L 21/8238* (2006.01)
*H01L 21/336* (2006.01)
*H01L 21/20* (2006.01)
*H01L 21/461* (2006.01)

(52) U.S. Cl. ........ 438/385; 438/197; 438/199; 438/200; 438/257; 438/301; 438/382; 438/725; 257/E21.004; 257/E21.616; 257/E21.645

(58) Field of Classification Search ........... 257/E21.004, 257/E21.409, E21.616, E21.645
See application file for complete search history.

(56) References Cited

U.S. PATENT DOCUMENTS

| | | | |
|---|---|---|---|
| 2007/0093015 A1* | 4/2007 | Kudo et al. | 438/199 |
| 2007/0096183 A1 | 5/2007 | Ogawa et al. | |
| 2007/0173066 A1 | 7/2007 | Kokura et al. | |
| 2007/0178636 A1* | 8/2007 | Nishibe et al. | 438/210 |
| 2008/0116526 A1* | 5/2008 | Amishiro et al. | 257/379 |
| 2010/0327370 A1* | 12/2010 | Jan et al. | 257/380 |

FOREIGN PATENT DOCUMENTS

| | | |
|---|---|---|
| JP | 2007-053344 A | 3/2007 |
| JP | 2007-123632 A | 5/2007 |
| JP | 2008-244124 A | 10/2008 |

\* cited by examiner

*Primary Examiner* — Mohsen Ahmadi
(74) *Attorney, Agent, or Firm* — Westerman, Hattori, Daniels & Adrian, LLP

(57) ABSTRACT

A polysilicon film to be a resistor element is formed on a resistor element formation region of a semiconductor substrate while a polysilicon gate and high concentration impurity regions are formed on a transistor formation region. Thereafter, an insulating film is formed on the entire surface of the semiconductor substrate. Then, a photoresist film is formed to cover the transistor formation region, and a conductive impurity is ion-implanted into the polysilicon film. Next, the photoresist film is removed by ashing.

12 Claims, 19 Drawing Sheets

METHOD OF MANUFACTURING SEMICONDUCTOR DEVICE

CROSS-REFERENCE TO RELATED APPLICATIONS

This application is based upon and claims and the benefit of priority of the prior Japanese Patent Application No. 2010-117333, filed May 21, 2010, the entire contents of which are incorporated herein by reference.

FIELD

The embodiments discussed herein are related to a method of manufacturing a semiconductor device having a resistor element.

BACKGROUND

A resistor element is one of important elements for forming an electronic circuit. Many semiconductor devices (LSI: Large Scale Integration) are formed with resistor elements included therein. A polysilicon resistor element is one of resistor elements to be embedded in a semiconductor device. The polysilicon resistor element is a resister element formed by implanting a conductive impurity such as P (phosphorus) into a polysilicon film. Many of manufacturing processes are common to a polysilicon resistor element and a transistor.

Patent Citation 1: Japanese Laid-open Patent Publication No. 2008-244124

Patent Citation 2: Japanese Laid-open Patent Publication No. 2007-123632

Patent Citation 3: Japanese Laid-open Patent Publication No. 2007-53344

When a polysilicon resistor element and a transistor are formed simultaneously, the characteristics of the transistor degrade in some cases.

SUMMARY

According to an aspect, there is provided a method of manufacturing a semiconductor device, the method including: forming a first insulating film in a resistor element formation region of a semiconductor substrate, forming a gate insulating film in a transistor formation region of the semiconductor substrate, forming a semiconductor film above the first insulating film while forming a gate made of semiconductor above the gate insulating film, forming impurity regions by ion-implanting a conductive impurity into the transistor formation region of the semiconductor substrate with the gate used as a mask, the impurity regions formed to be a source and a drain, forming a second insulating film covering the semiconductor film, the impurity regions and the gate, forming a resist film above the second insulating film in the transistor formation region, ion-implanting a conductive impurity into the semiconductor film with the resist film used as a mask under a condition that the conductive impurity penetrates through the second insulating film in the resistor element formation region, removing the resist film by ashing, and removing the second insulating film in the transistor formation region while leaving the second insulating film in the resistor element formation region.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, before embodiments are described, preliminary matters are described for facilitating understanding of the embodiments.

FIGS. 1A to 1K are cross-sectional views illustrating an example of a method of manufacturing a semiconductor device. FIGS. 1A to 1K each illustrate a resistor element formation region where a polysilicon resister element is formed and a transistor formation region where an n-type MOS transistor is formed.

Figure 1A:
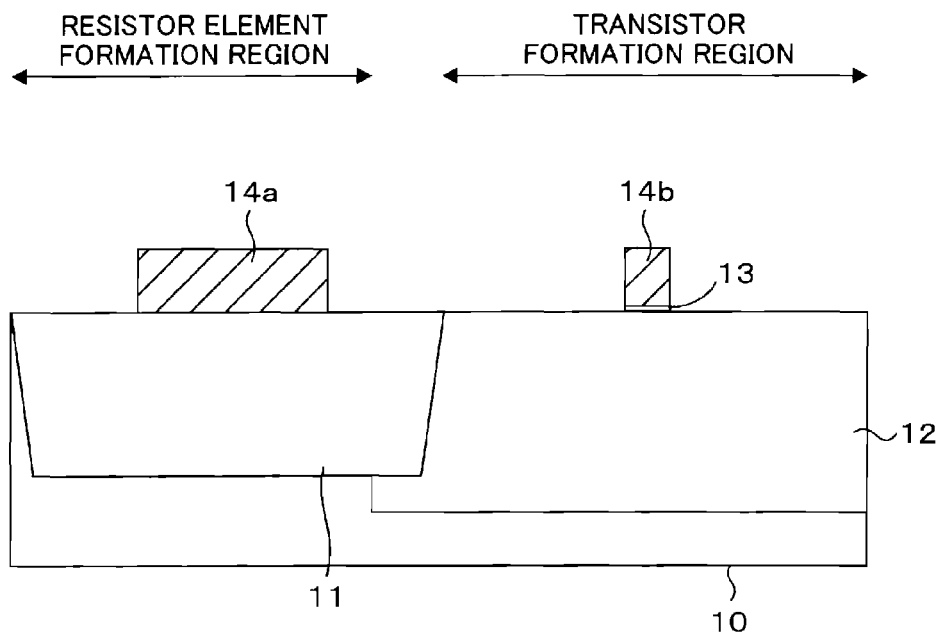
FIGS. 1A to 1K are cross-sectional views illustrating an example of a method of manufacturing a semiconductor device.

Firstly, an element isolation film 11 is formed in a predetermined region of a p-type semiconductor substrate (silicon substrate) 10 as illustrated in FIG. 1A. Then, a p-well 12 is formed by ion-implanting a p-type conductive impurity such as B (boron) into the transistor formation region of the semiconductor substrate 10.

Next, after a gate insulating film 13 is formed by thermally oxidizing a surface of the p-well 12, a polysilicon film is formed on the entire upper surface of the semiconductor substrate 10 by a CVD (Chemical Vapor Deposition) method or the like. Then, the polysilicon film is patterned using photolithography and etching. Thus, a polysilicon film 14a is formed on the resistor element formation region while a polysilicon gate 14b is formed on the transistor formation region, the polysilicon film 14a having a predetermined shape and formed to be a resistor element.

Figure 1B:
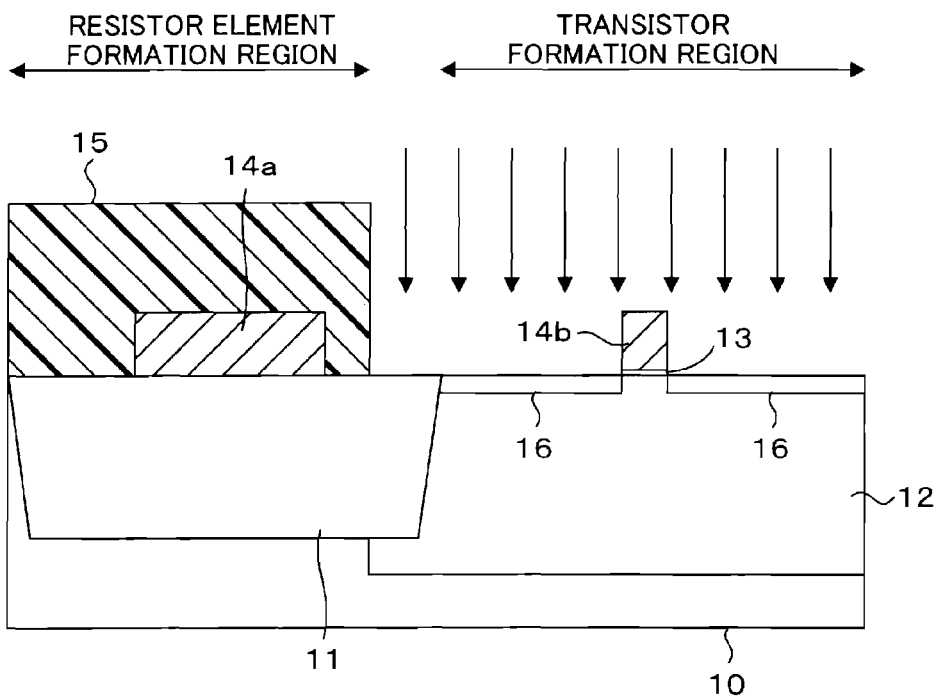

Next, a photoresist film 15 is formed to cover the resistor element formation region as illustrated in FIG. 1B. Then, an n-type conductive impurity such as As (arsenic) is shallowly ion-implanted into the p-well 12 with the polysilicon gate 14b used as a mask. Thus, extension regions 16 are formed on surface layer portions of the p-well 12 on both sides of the polysilicon gate 14b. Thereafter, the photoresist film 15 is removed.

Figure 1C:
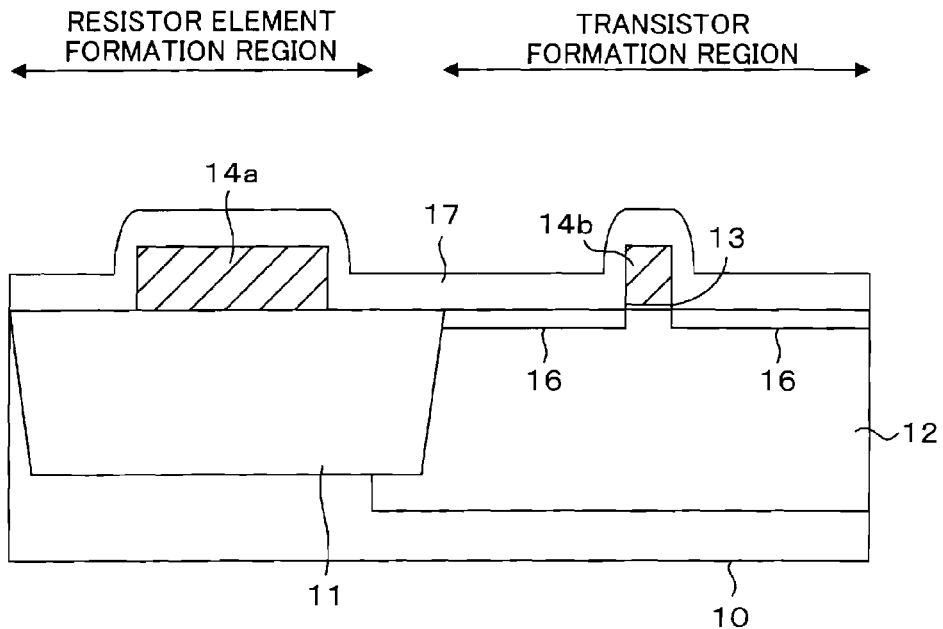
Figure 1D:
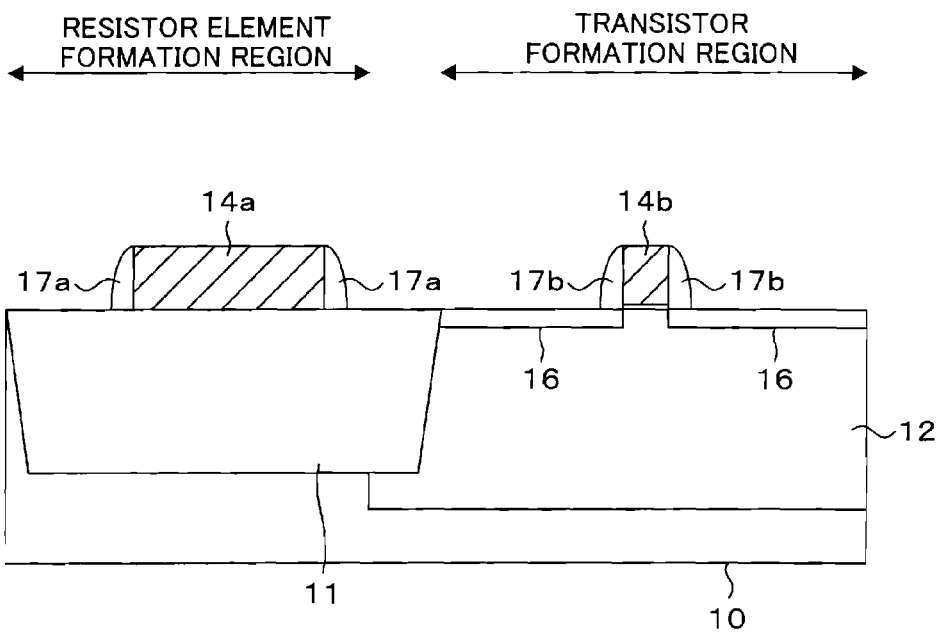

Next, an insulating film 17 is formed on the entire upper surface of the semiconductor substrate 10 as illustrated in FIG. 1C. Thereafter, the insulating film 17 is etched back to form sidewalls 17a on side portions of the polysilicon film 14a and also to form sidewalls 17b on side portions of the polysilicon gate 14b as illustrated in FIG. 1D.

Figure 1E:
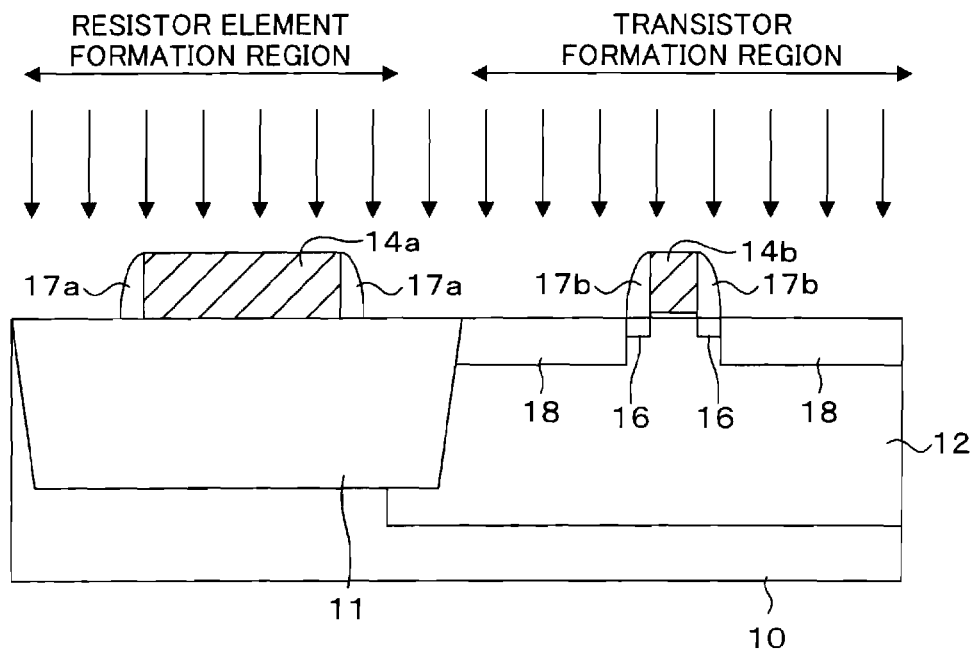

Next, as illustrated in FIG. 1E, an n-type conductive impurity such as As (arsenic) is ion-implanted into the p-well 12 in a highly concentrated manner with the polysilicon gate 14b and the sidewalls 17b used as masks to form n-type high concentration impurity regions 18 serving as a source and a drain. The ion-implantation of the n-type conductive impurity causes a region of each of the extension regions 16 except for a portion below a corresponding one of the sidewalls 17b to become the n-type high concentration impurity region 18. In addition, at the same time, the n-type conductive impurity is also ion-implanted into the polysilicon film 14a and the polysilicon gate 14b. Thus, the resistance values of the polysilicon film 14a and the polysilicon gate 14b are reduced.

Figure 1F:
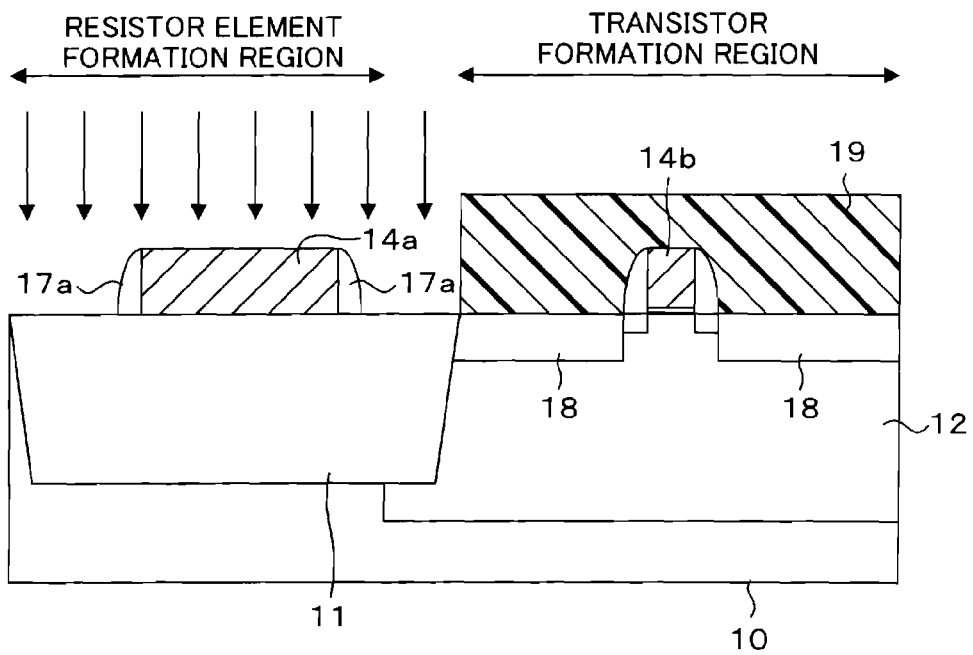
Figure 1G:
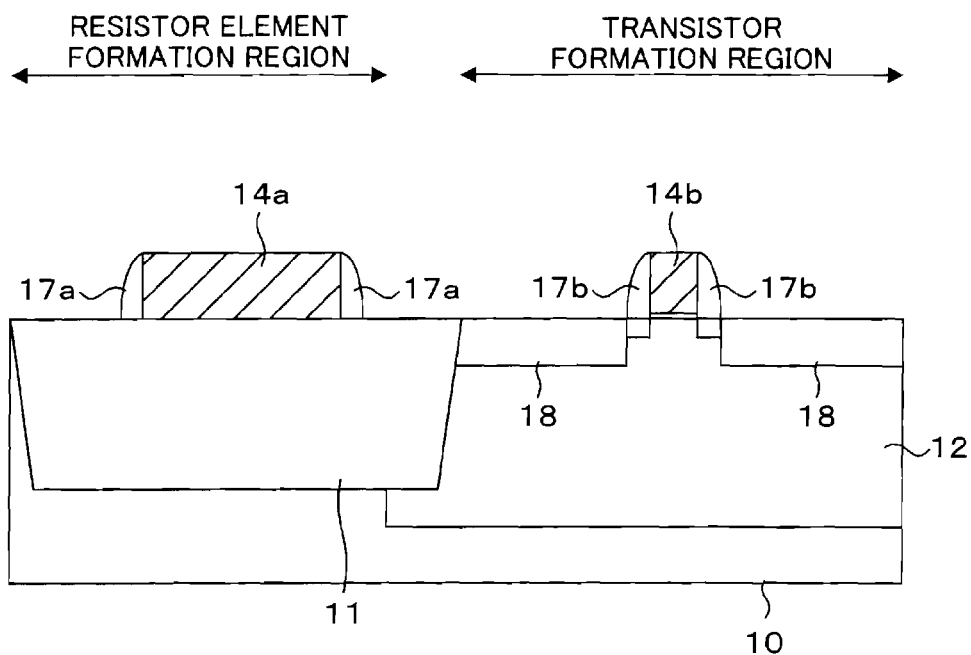

Next, as illustrated in FIG. 1F, after a photoresist film 19 is formed to cover the transistor formation region, an n-type conductive impurity such as As is ion-implanted into the polysilicon film 14a to adjust the resistance value of the polysilicon film 14a (polysilicon resistor element). Thereafter, as illustrated in FIG. 1G, after the photoresist film 19 is removed by ashing, the surface of the substrate where the photoresist film 19 has been attached is wet-cleaned by a sulfuric acid aqueous solution or the like.

Figure 1H:
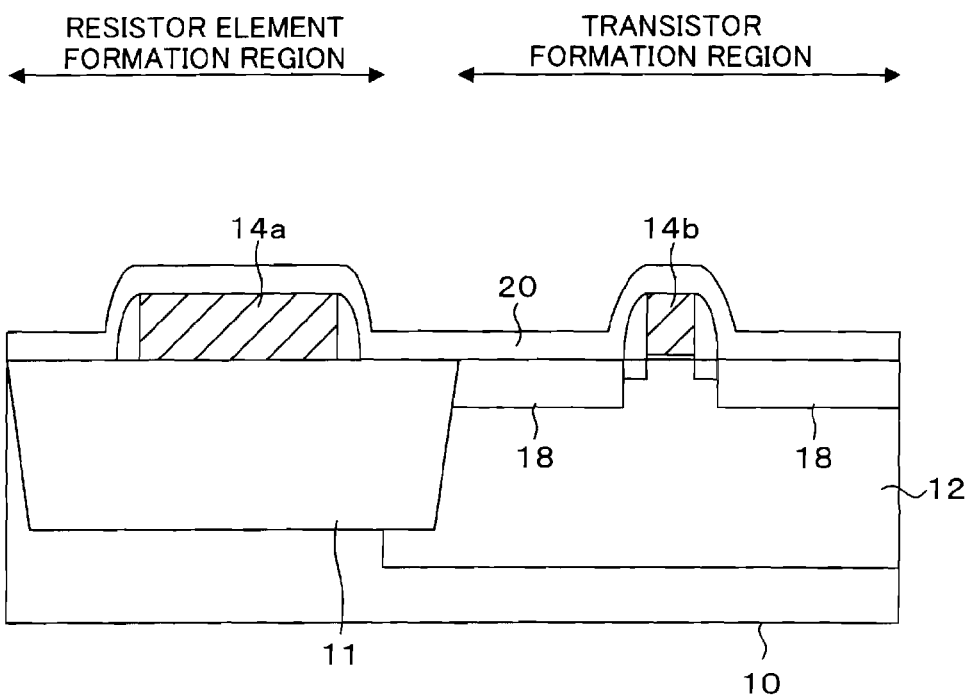
Figure 1I:
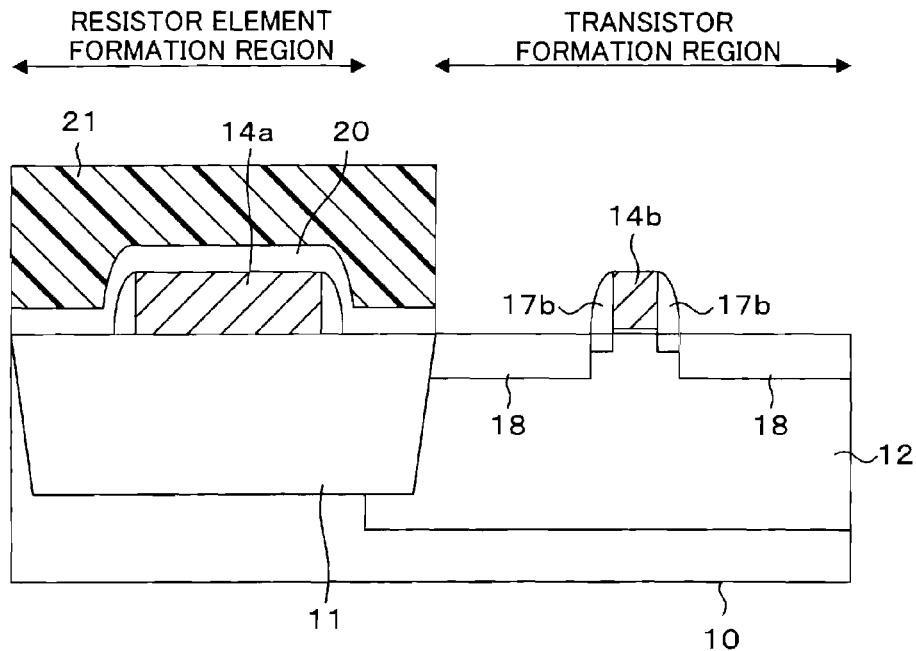

Next, as illustrated in FIG. 1H, an insulating film 20 to be a silicide block is formed on the entire upper surface of the semiconductor substrate 10. Then, as illustrated in FIG. 1I, a photoresist film 21 is formed to cover the resistor element formation region, and then, the insulating film 20 on the transistor formation region is removed to expose the high concentration impurity regions 18 and the polysilicon gate 14b. Thereafter, the photoresist film 21 is removed.

Figure 1J:
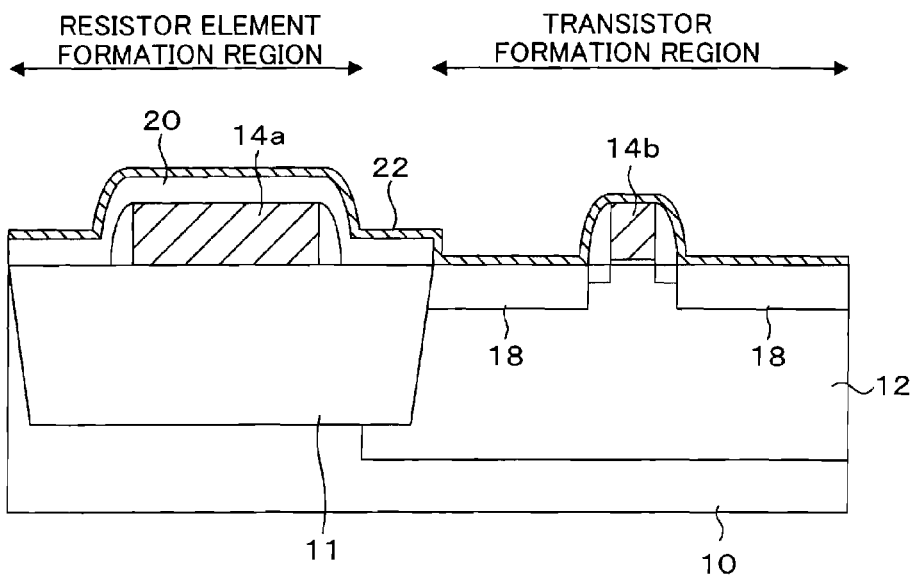
Figure 1K:
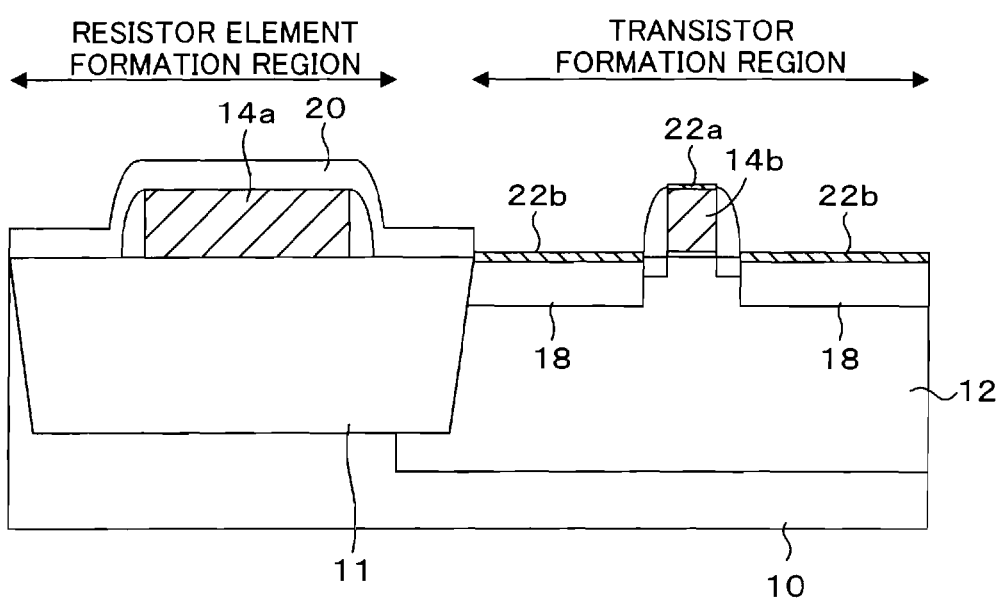

Next, as illustrated in FIG. 1J, after a Co (cobalt) film 22 is formed on the entire upper surface of the semiconductor substrate 10, annealing treatment is performed. Thus, silicon on the upper surfaces of the high concentration impurity regions 18 and silicon on the upper surface of the polysilicon gate 14b react with Co of the Co film 22, thus forming silicide. Thereafter, the Co film 22 is removed. In this manner, a silicide film 22a is formed on the polysilicon gate 14b, and silicide films 22b are formed on the high concentration impurity regions 18 as illustrated in FIG. 1K.

Next, after an interlayer insulating film (not illustrated) is formed on the entire upper surface of the semiconductor substrate 10, wiring (not illustrated) electrically connecting to the polysilicon film 14a and the silicide films 22a and 22b is formed. In the manner described above, a semiconductor device having a polysilicon resistor element and a MOS transistor of a Lightly Doped Drain (LDD) structure is completed.

Incidentally, when a semiconductor device is manufactured by the aforementioned method, it is found that surface irregularities are formed on the surfaces of the polysilicon gate 14b and the high concentration impurity regions 18 (source and drain), and the transistor characteristics degrade. The formation of the surface irregularities is considered to occur due to the following reason.

Specifically, when the conductive impurity is ion-implanted into the polysilicon film 14a during the step illustrated in FIG. 1F, a large amount of the conductive impurity is also ion-implanted into the photoresist film 19. Here, it is possible to easily remove, by a remover, a photoresist film into which no conductive impurity is implanted. However, it is difficult to remove, by a remover, a photoresist film into which the conductive impurity is implanted. Thus, ashing is used to remove the photoresist film in this case.

In general, plasma of a gas essentially containing oxygen is used for ashing of a photoresist film, and the semiconductor substrate is heated to increase the reactivity. In order to remove a resist film into which a large amount of conductive impurity is ion-implanted, measures such as an increase in the plasma energy, an increase in the temperature of the substrate and the like are preferable. However, the surface of the semiconductor substrate is damaged because of such measures, and thus the transistor characteristics degrade in this case.

In addition, in the aforementioned method, after the photoresist film 19 is removed by ashing in the steps illustrated in FIGS. 1F and 1G, the semiconductor substrate 10 is taken out from the ashing apparatus and brought into the atmosphere. At this time, the conductive impurity (P in the aforementioned example) ion-implanted into the polysilicon film 14a and the element isolation film 11 of the resistor element formation region, as well as the high concentration impurity regions 18 and the like reacts with O and H in the atmosphere and thus generates acid (phosphoric acid: $H_3PO_4$ in the aforementioned example). This acid dissolves the polysilicon of the polysilicon gate 14b and the high concentration impurity regions 18 and causes a defect, thereby, leading to degradation of the transistor characteristics. In particular, when P is implanted into the polysilicon film 14a at a concentration equal to or greater than $5.0\times10^{15}$ $cm^{-2}$, the degradation of the transistor characteristics becomes obvious.

Furthermore, in the aforementioned manufacturing method, the temperature of the polysilicon film 14a becomes high during the ashing process of the photoresist film 19 and the film-forming process of the insulating film 20. For this reason, there is another problem that the conductive impurity is diffused into the atmosphere from the polysilicon film 14a (out-diffusion), thus, causing a change in the resistance value.

Hereinafter, the embodiments are described with reference to the accompanying drawings.

First Embodiment

Figure 2A:
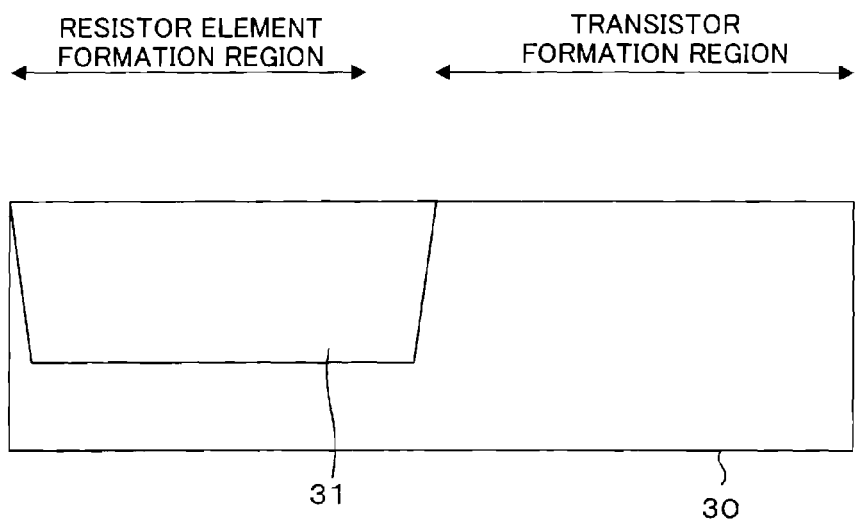
FIGS. 2A to 2Q are cross-sectional views illustrating a method of manufacturing a semiconductor device according to a first embodiment.
Figure 2B:
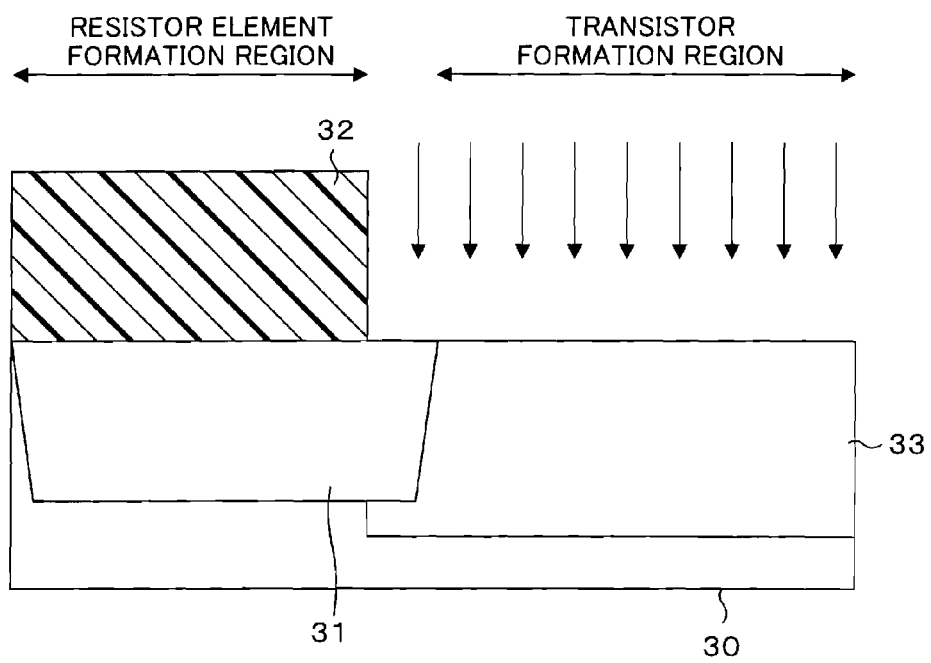
Figure 2C:
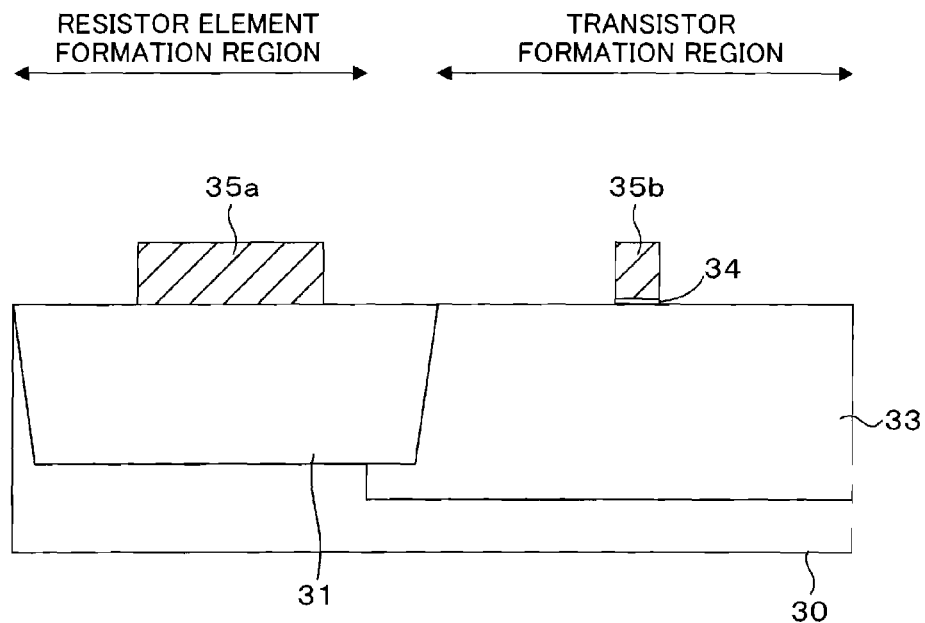
Figure 2D:
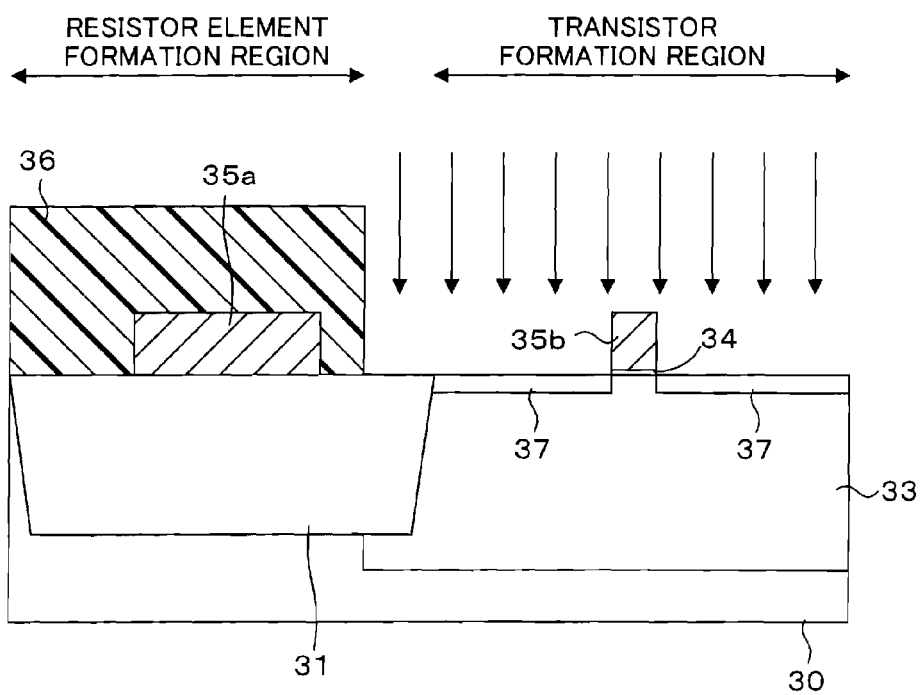
Figure 2E:
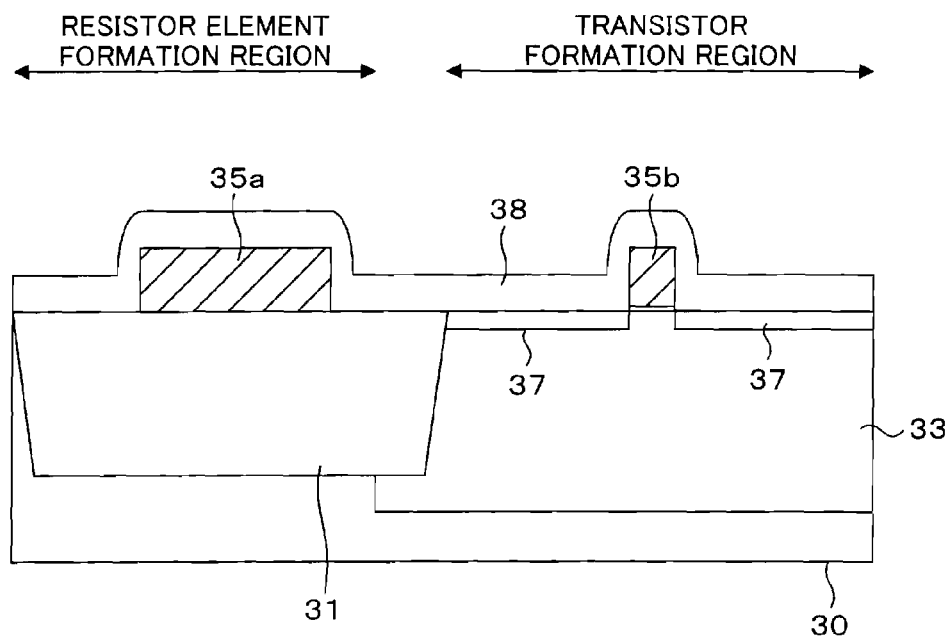
Figure 2F:
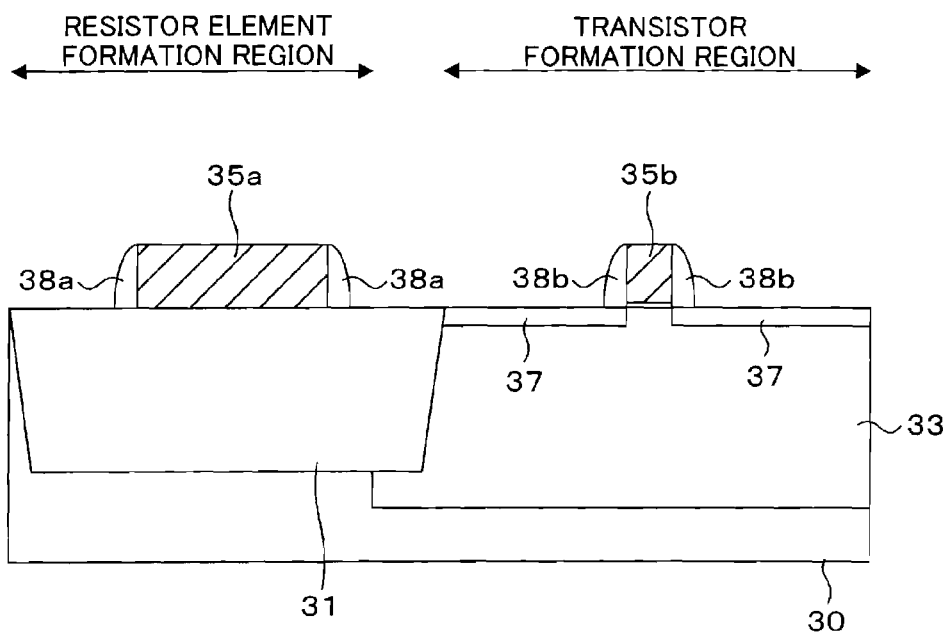
Figure 2G:
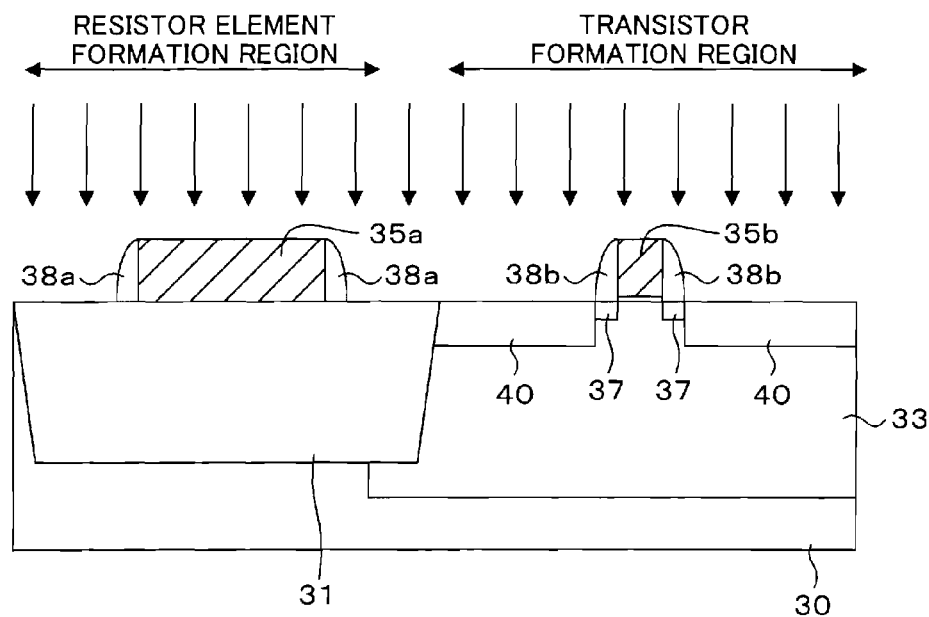
Figure 2H:
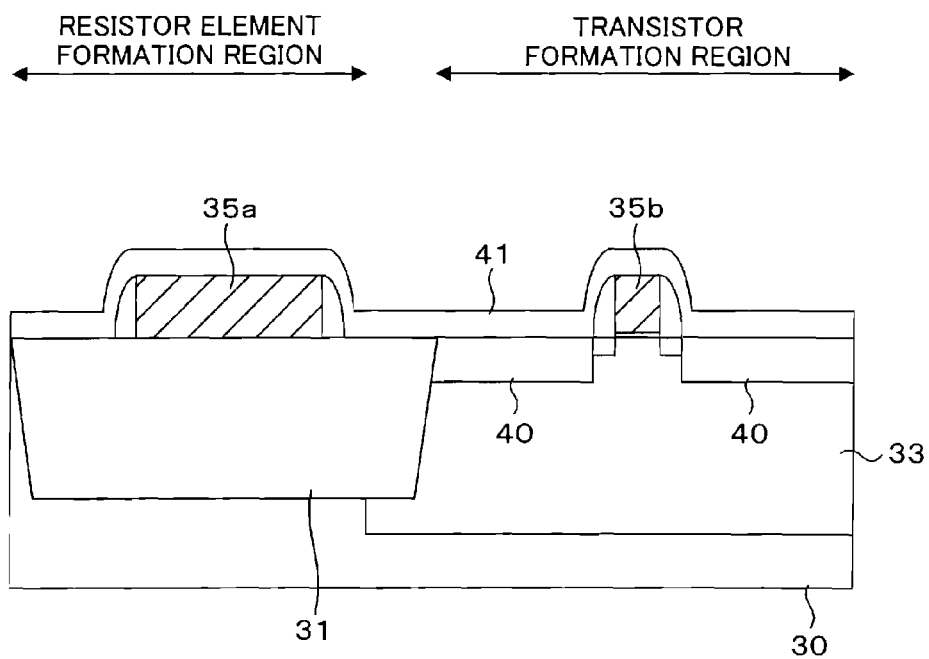
Figure 2I:
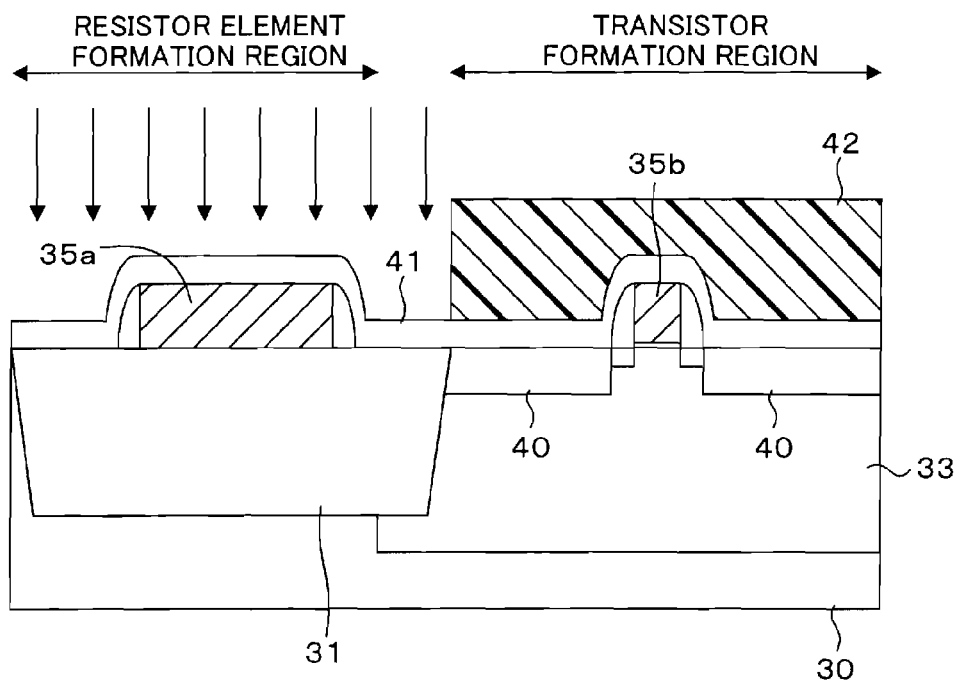
Figure 2J:
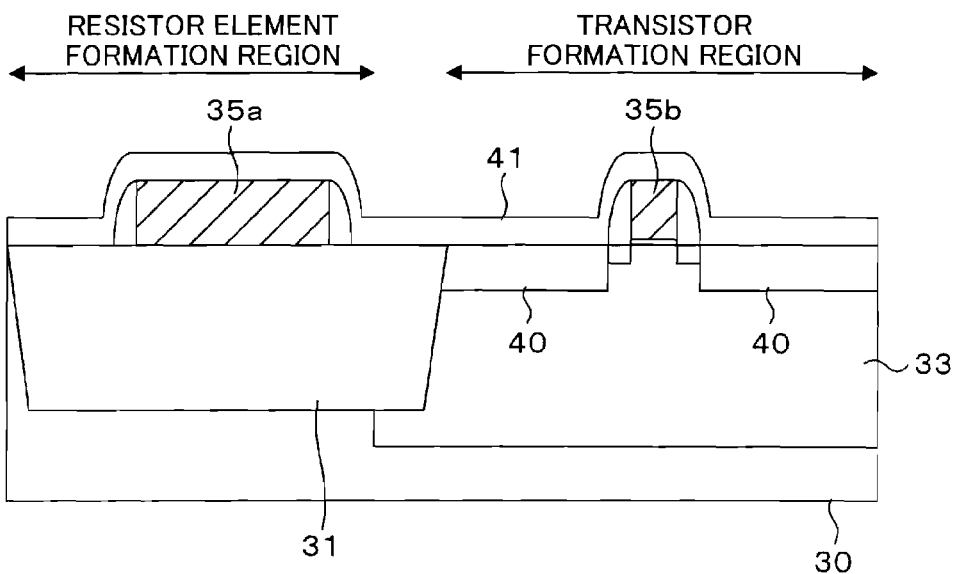
Figure 2K:
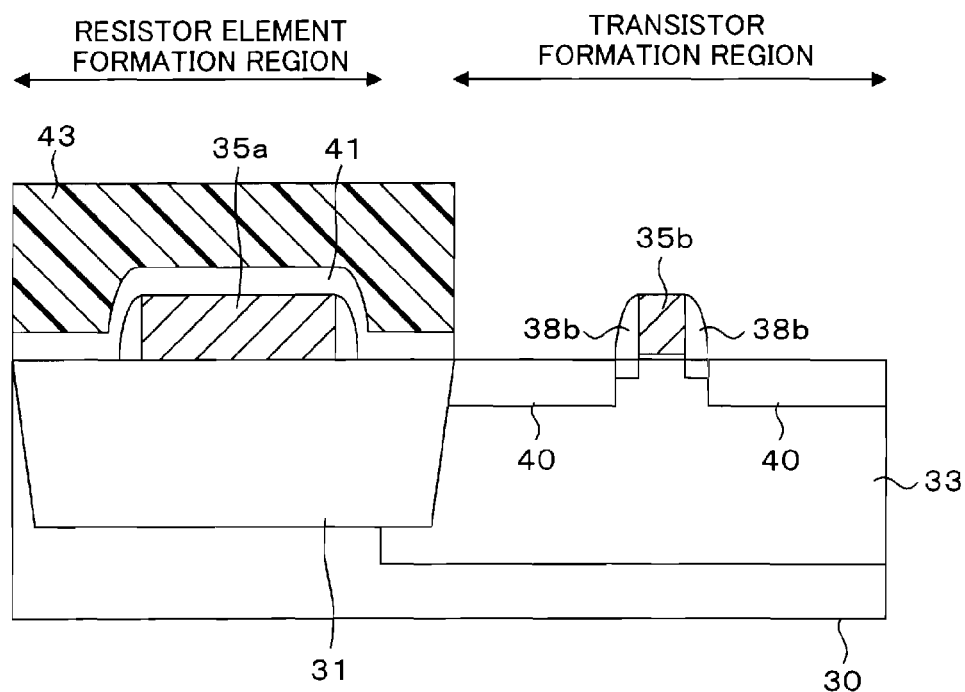
Figure 2L:
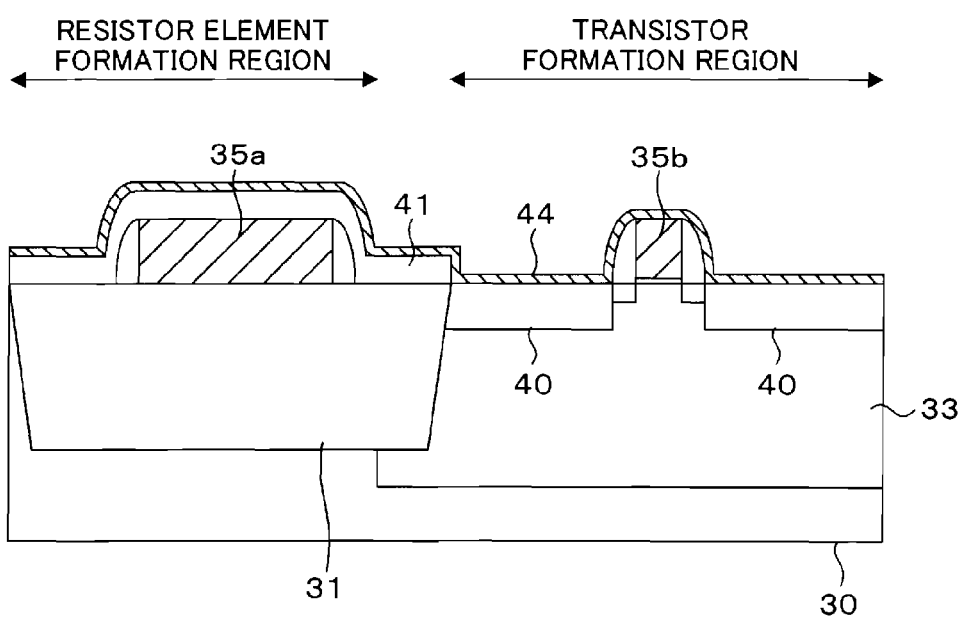
Figure 2M:
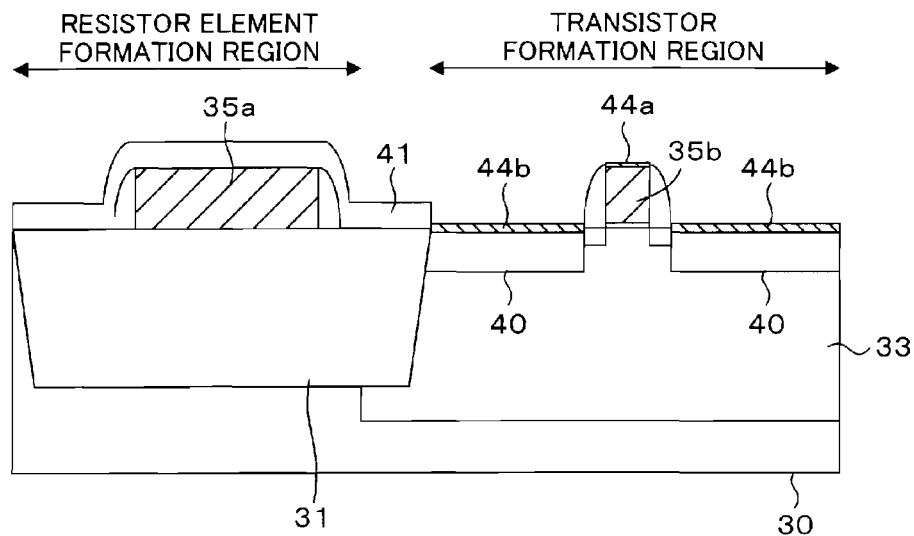
Figure 2N:
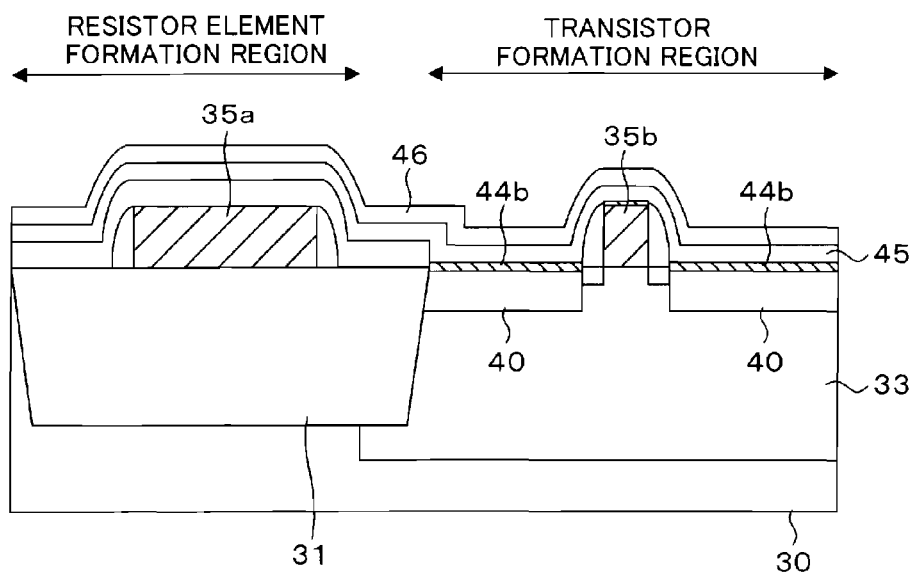
Figure 2O:
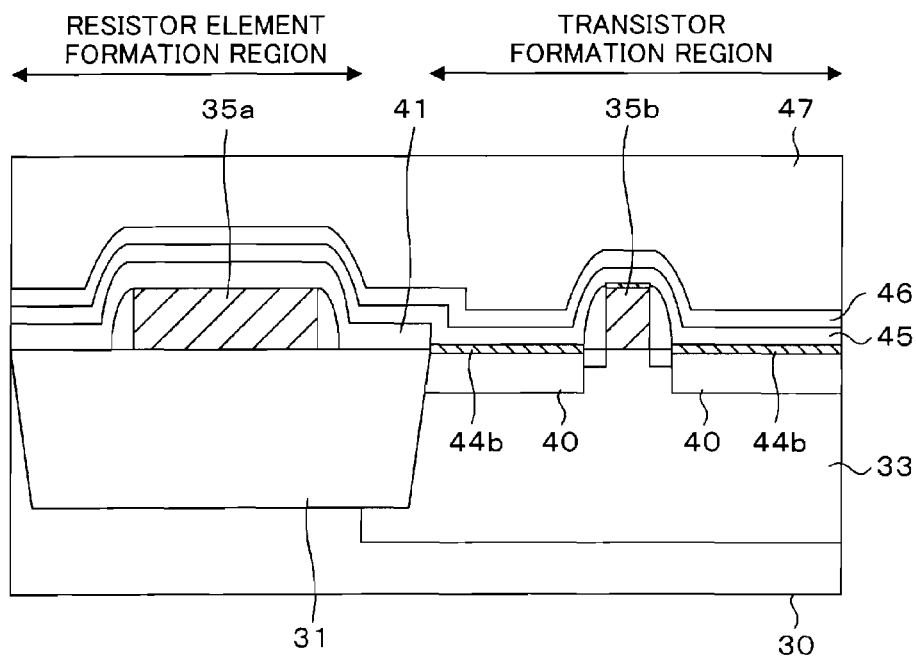
Figure 2P:
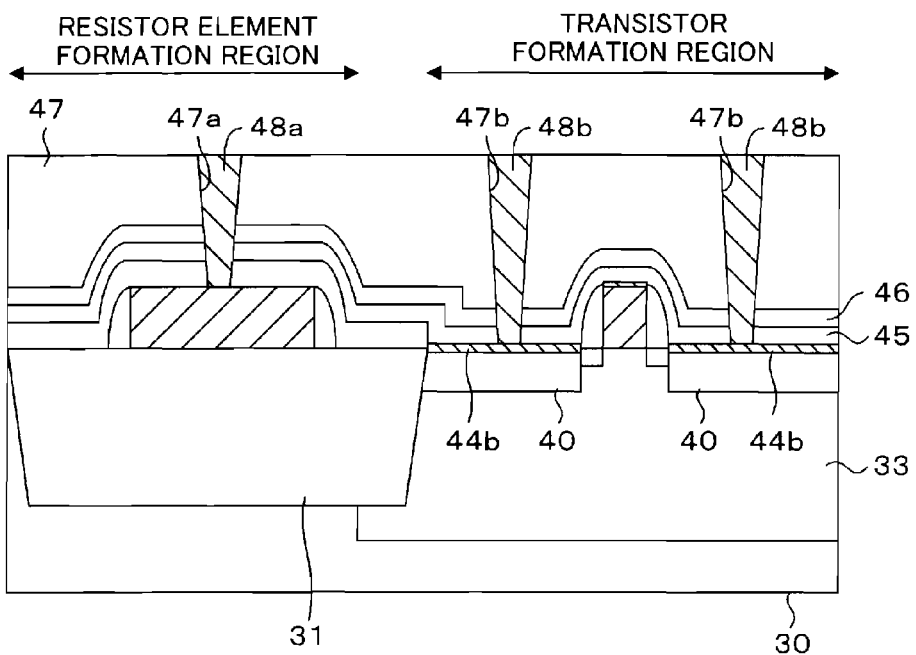
Figure 2Q:
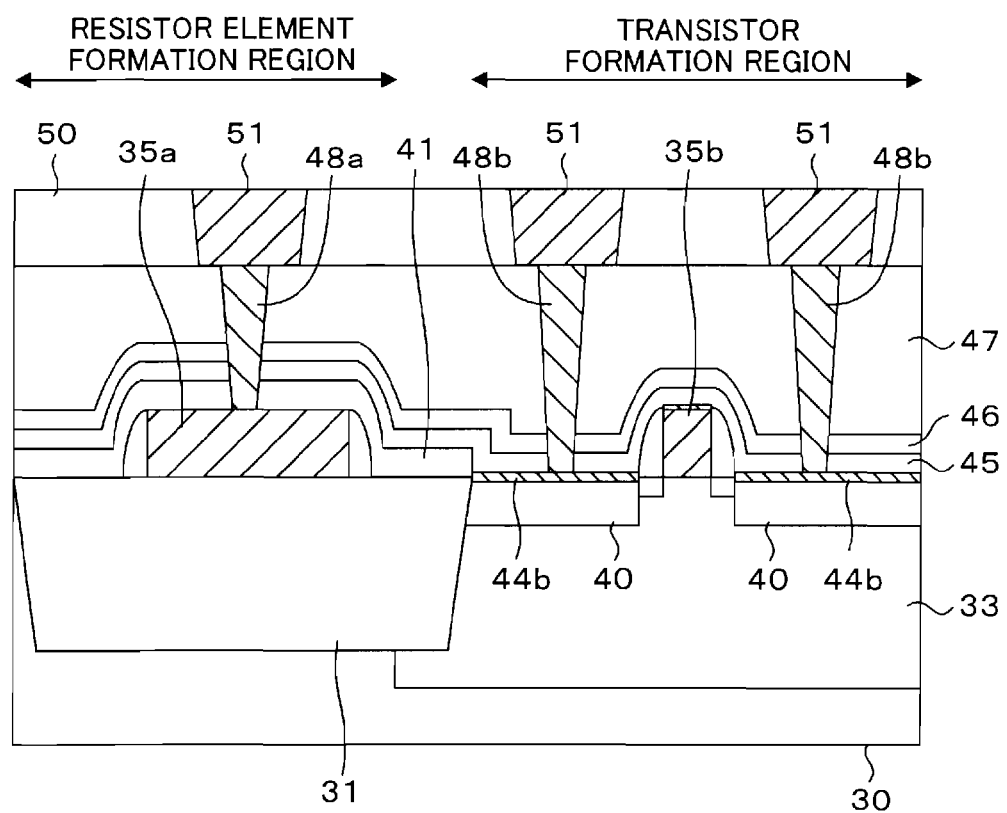

FIGS. 2A to 2Q are cross-sectional views illustrating a method of manufacturing a semiconductor device according to a first embodiment in the order of manufacturing steps. FIGS. 2A to 2Q each illustrate a resistor element formation region where a polysilicon resistor element is formed and a transistor formation region where an n-type MOS transistor is formed.

Firstly, as illustrated in FIG. 2A, an element isolation film 31 is formed in a predetermined region of a p-type semiconductor substrate (silicon substrate) 30 by a publicly known Shallow Trench Isolation (STI) technique or Local Oxidation of Silicon (LOCOS) technique. The thickness of the element isolation film 31 is set to 300 nm, for example.

Next, a photoresist film 32 is formed to cover the resistor element formation region as illustrated in FIG. 2B. Thereafter, a p-well 33 is formed by ion-implanting a p-type conductive impurity into the transistor formation region. Here, the p-well 33 is formed by ion-implanting B (boron) under the conditions that the acceleration energy is 150 keV and the dose amount is $3.0\times10^{13}$ $cm^{-2}$. The photoresist film 32 is removed after the p-well 33 is formed.

Next, as illustrated in FIG. 2C, a gate insulating film 34 is formed by thermally oxidizing a surface of the p-well 33. Thereafter, polysilicon is deposited on the entire upper surface of the semiconductor substrate 30 by a CVD method to form a polysilicon film having a thickness of 105 nm, for example. Then, the polysilicon film is patterned using photolithography and etching. Thus, a polysilicon film 35a to be a resistor element is formed on the resistor element formation region while a polysilicon gate 35b is formed on the transistor formation region.

Next, a photoresist film 36 is formed to cover the resistor element formation region as illustrated in FIG. 2D. Thereafter, extension regions 37 are formed by ion-implanting an n-type conductive impurity such as As into the p-well 33 with the polysilicon gate 35b used as a mask under the conditions that the acceleration energy is 1 keV and the dose amount is $8.0\times10^{14}$ $cm^{-2}$, for example. After the extension regions 37 are formed, the photoresist film 36 is removed.

Next, as illustrated in FIG. 2E, an insulating film 38 to be sidewalls is formed on the entire upper surface of the semiconductor substrate 30. Here, a BTO (barium titanate:

BaTiO$_3$) film is formed with a thickness of 70 nm as the insulating film 38 by a CVD method. The temperature of the substrate when the BTO film is formed is set to 520° C., for example. Note that, an insulating material other than BTO, such as SiO$_2$ and SiN may be used to form the insulating film 38, for example.

Next, as illustrated in FIG. 2F, the insulating film 38 is etched back to form sidewalls 38a on side portions of the polysilicon film 35a and also to form sidewalls 38b on side portions of the polysilicon gate 35b. Note that, when BTO is used to form the insulating film 38, dry etching using a fluorocarbon gas such as CF$_4$ or CHF$_3$ is performed to etch the insulating film 38, for example.

Next, as illustrated in FIG. 2G, an n-type conductive impurity is ion-implanted into the polysilicon film 35a, the polysilicon gate 35b and the p-well 33 in a highly concentrated manner. Here, As (arsenic) and P (phosphorus) are ion-implanted into the polysilicon film 35a, the polysilicon gate 35b and the p-well 33. As is ion-implanted under the conditions that the acceleration energy is 20 keV and the dose amount is $4.0 \times 10^{15}$ cm$^{-2}$, for example. In addition, P is ion-implanted under the conditions that the acceleration energy is 10 keV and the dose amount is $5.0 \times 10^{14}$ cm$^{-2}$, for example.

Thereafter, annealing is performed at a temperature of 1025° C., for example, and the ion-implanted conductive impurity is activated.

The ion-implantation of the n-type conductive impurity causes a decrease in the resistance values of the polysilicon film 35a and the polysilicon gate 35b, and also forms n-type high concentration impurity regions 40 to be a source and a drain on surfaces of the substrate on both sides of the polysilicon gate 35b. In addition, the ion-implantation of the n-type conductive impurity causes a region of each of the extension regions 37 except for a portion below a corresponding one of the sidewalls 38b to become the n-type high concentration impurity region 40.

Note that, in this embodiment, in the step of FIG. 2G, the n-type conductive impurity is implanted into the transistor formation region while the n-type conductive impurity is also implanted into the polysilicon film 35a on the resistor element formation region. However, the resistor element formation region may be covered by a resist mask during this step, for example, and thus the n-type conductive impurity may be selectively implanted into the transistor formation region.

Next, as illustrated in FIG. 2H, an insulating film 41 to be a silicide block is formed on the entire upper surface of the semiconductor substrate 30. Here, a BTO film is formed with a thickness of 35 nm as the insulating film 41 by a CVD method. The temperature of the substrate when the BTO film is formed is set to 520° C., for example. Note that, an insulating material other than BTO, such as SiO$_2$ and SiN may be used to form the insulating film 41.

Next, as illustrated in FIG. 2I, a photoresist film 42 is formed to cover the transistor formation region. Thereafter, an n-type conductive impurity such as P is ion-implanted into the polysilicon film 35a on the resistor element formation region under the conditions that the acceleration energy is 30 keV and the dose amount is $5.15 \times 10^{15}$ cm$^{-2}$, for example, to adjust the resistance value of the polysilicon film 35a (resistor element). Here, the ion-implantation conditions of the conductive impurity are changed as needed in accordance with the resistance value of the resistor element to be formed.

Next, as illustrated in FIG. 2J, the photoresist film 42 is removed by ashing process. The temperature of the substrate during the ashing process is set between 80° C. to 400° C., approximately. Thereafter, the surface of the substrate where the photoresist film 42 has been attached is wet-cleaned by use of a sulfuric acid aqueous solution.

In this ashing process, the polysilicon gate 35b and the high concentration impurity regions 40 are covered with the insulating film 41 in this embodiment. Thus, damage to the polysilicon gate 35b and the surface of the substrate (high concentration impurity regions 40) is avoided. Furthermore, even if the conductive impurity ion-implanted into the insulating film 41 on the resistor element formation region reacts with O and H in the atmosphere and thus generates acid, dissolution of the polysilicon gate 35b and the high concentration impurity regions 40 by the acid is avoided. Thus, a transistor having good characteristics may be obtained.

Note that, the temperature of the substrate during the ashing process is preferably equal to or less than 150° C. in order to suppress acid generation. In addition, although a sulfuric acid aqueous solution is used as a wet cleaning solution in this embodiment, a solution other than the sulfuric acid aqueous solution may be used as a wet-cleaning solution. The solutions usable as a wet-cleaning solution include a hydrofluoric acid (HF) aqueous solution, a hydrogen peroxide (H$_2$O$_2$) solution, an ammonium hydroxide (NH$_4$OH) aqueous solution, pure water, a hydrochloric acid (HCl) aqueous solution and the like, for example.

Next, as illustrated in FIG. 2K, a photoresist film 43 is formed to cover the resistor element formation region. Then, the insulating film 41 on the transistor formation region is removed by an etching process to expose the upper surfaces of the high concentration impurity regions 40 and the polysilicon gate 35b. The insulating film 41 is a BTO film, for example. In this case, dry etching using a fluorocarbon gas such as CF$_4$ or CHF$_3$ is performed to etch the insulating film 41, for example. After the insulating film 41 is etched, the photoresist film 43 is removed.

Next, as illustrated in FIG. 2L, a Co film 44 is formed on the entire upper surface of the semiconductor substrate 30 with a thickness of 4 nm, for example, and a TiN film is further formed as a cap layer (not illustrated) on the Co film 44 with a thickness of 30 nm. Thereafter, the substrate is kept in a nitrogen (N$_2$) atmosphere for 30 seconds at a temperature of 520° C., for example, to cause Co and silicon to react with each other. Thereafter, the Co film 44 and the cap layer are removed. Thus, a silicide film 44a is formed on the polysilicon gate 35b and silicide films 44b are formed on the high concentration impurity regions 40 as illustrated in FIG. 2M. Thereafter, annealing is performed in a nitrogen atmosphere for 30 seconds at a temperature of 700° C., for example, to stabilize (to reduce) the resistance values of the silicide films 44a and 44b. Note that, the metal used to form the silicide is not limited to Co described above, and Ti (titanium), Ni (nickel) or any other metal may be used. In addition, the cap layer may be formed as appropriate, or the cap layer may not be formed at all.

Next, as illustrated in FIG. 2N, a SiN film 45 is formed on the entire upper surface of the semiconductor substrate 30 with a thickness of 80 nm, for example. Further, a SiO$_2$ film 46 is formed on the SiN film 45 with a thickness of 60 nm, for example.

Next, as illustrated in FIG. 2O, a SiO$_2$ film 47 is formed on the SiO$_2$ film 46 with a thickness of 575 nm by a plasma CVD method using a mixed gas of a tetraethoxysilane (TEOS) gas and an oxygen gas, for example. Thereafter, a CMP method is used to polish the surface of the SiO$_2$ film 47 while reducing the thickness thereof by approximately 320 nm, thereby planarizing the surface of the SiO$_2$ film 47.

Next, a contact hole 47a extending to the polysilicon film 35a and contact holes 47b extending to the silicide films 44b and the like are formed from the upper surface of the SiO$_2$ film 47 by photolithography and etching as illustrated in FIG. 2P. Thereafter, a glue layer (not illustrated) is formed on the entire surface so as to cover the wall surface of each of the contact holes 47a and 47b. In this embodiment, a Ti film having a thickness of 5 nm is formed as the glue layer.

Next, W (tungsten) is deposited with a thickness of 200 nm on the entire upper surface of the semiconductor substrate 30 by a CVD method, for example, to fill the contact holes 47a and 47b with W. Thereafter, W and the glue layer are polished by a CMP method until the SiO$_2$ film 47 is exposed. Thus, a plug 48a electrically connected to the polysilicon film 35a and plugs 48b electrically connected to the high concentration impurity regions 40 and the like are formed.

Next, a SiO$_2$ film 50 is formed on the entire upper surface of the semiconductor substrate 30, and grooves with a depth extending to the plugs 48a and 48b are formed from the upper surface of the SiO$_2$ film 50 into a desired wiring pattern as illustrated in FIG. 2Q. Thereafter, a Ti (titanium) film, for example, is formed with a thickness of 5 nm on the entire upper surface of the semiconductor substrate 30 as a barrier metal to cover the wall surfaces of the grooves. Next, Cu (copper) is deposited on the entire upper surface of the semiconductor substrate 30 by a CVD method, a plating method, or the like to fill the grooves with Cu. Thereafter, Cu and the barrier metal are polished by a CMP method until the SiO$_2$ film 50 is exposed. Accordingly, wiring 51 of a first wiring layer is formed.

Thereafter, formation of an interlayer insulating film and wiring is repeated to obtain a multilayer wiring structure. In this manner, a semiconductor device having a polysilicon resistor element and a MOS transistor of an LDD structure is completed.

In this embodiment, the polysilicon gate 35b and the high concentration impurity regions 40 are covered with the insulating film 41 when the photoresist film 42 is removed by an ashing process, as described above (refer to FIGS. 2I and 2J). Thus, damage to the polysilicon gate 35b and the high concentration impurity regions 40 due to the ashing process is avoided. In addition, even if the conductive impurity ion-implanted into the insulating film 41 on the resistor element formation region reacts with O and H in the atmosphere and thus generates acid, dissolution of the polysilicon gate 35b and the high concentration impurity regions 40 by the acid is avoided. Thus, a transistor having good characteristics may be obtained.

Moreover, in this embodiment, since the insulating film 41 covers the polysilicon film 35a into which the conductive impurity is implanted, there is an effect to avoid out-diffusion which is a phenomenon that the conductive impurity is diffused from the polysilicon film 35a (resistor element), thus, causing a change in the resistance value.

Second Embodiment

FIGS. 3A to 3H are cross-sectional views illustrating a method of manufacturing a semiconductor device according to a second embodiment in the order of manufacturing steps. Note that, in FIGS. 3A to 3H, the same reference numerals are assigned to the same components as those in FIGS. 2A to 2Q.

Figure 3A:
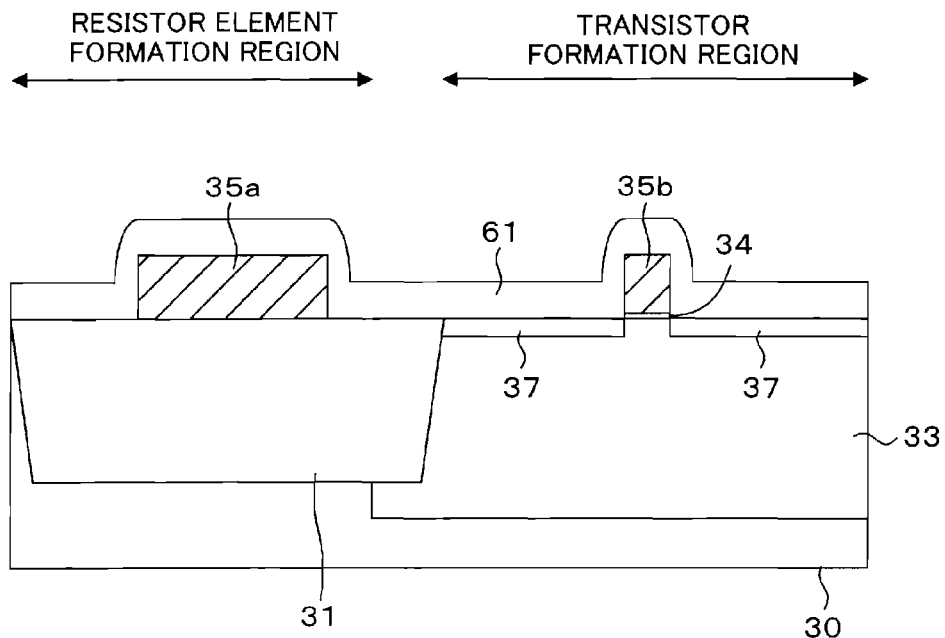
FIGS. 3A to 3H are cross-sectional views illustrating a method of manufacturing a semiconductor device according to a second embodiment.

Firstly, as illustrated in FIG. 3A, an element isolation film 31, a p-well 33, a gate insulating film 34, a polysilicon film 35a and a polysilicon gate 35b are formed on the upper surface of a p-type semiconductor substrate (silicon substrate) 30 in the same manner as the first embodiment. Then, an n-type conductive impurity is shallowly ion-implanted into the p-well 33 with the polysilicon gate 35b used as a mask. Thus, extension regions 37 are formed. Thereafter, an insulating film 61 to be sidewalls is formed on the entire upper surface of the semiconductor substrate 30. Here, BTO (BaTiO$_2$) is used to form the insulating film 61, and the thickness thereof is set to 70 nm. Note that, an insulating material other than BTO, such as SiO$_2$ and SiN may be used to form the insulating film 61.

Figure 3B:
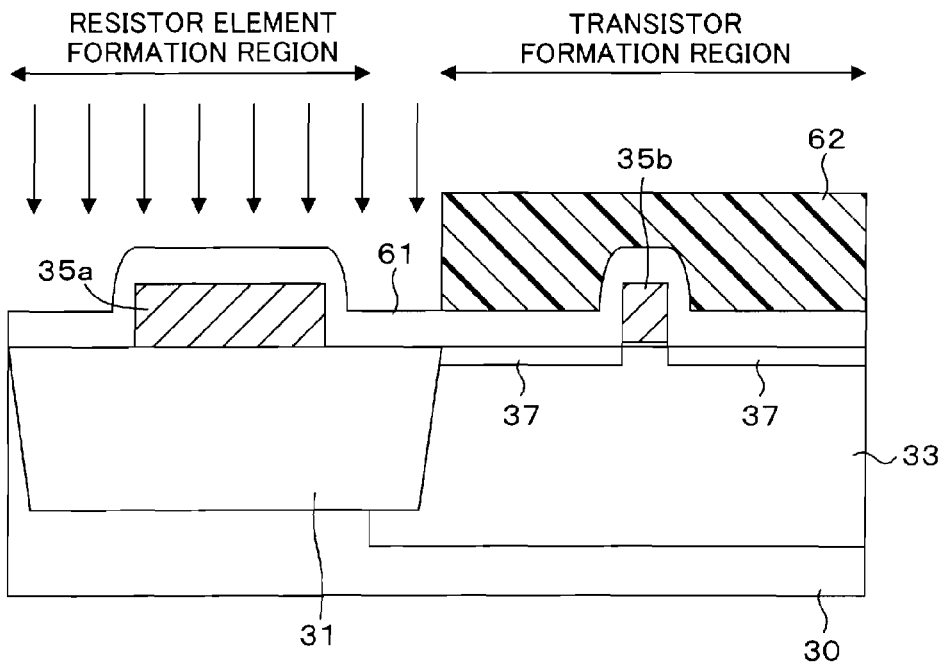

Next, a photoresist film 62 is formed to cover the transistor formation region as illustrated in FIG. 3B. Then, conductive impurity is ion-implanted into the polysilicon film 35a on the resistor element formation region under a condition that the conductive impurity penetrates through the insulating film 61. Here, P (phosphorus) is ion-implanted into the polysilicon film 35a as the conductive impurity with the acceleration energy set to 30 keV and the dose amount set to $5.15 \times 10^{15}$ cm$^{-2}$. However, the type of ions to be implanted into the polysilicon film 35a, and the acceleration energy and the dose amount in the ion-implantation are set appropriately in accordance with the resistor element to be formed.

Figure 3C:
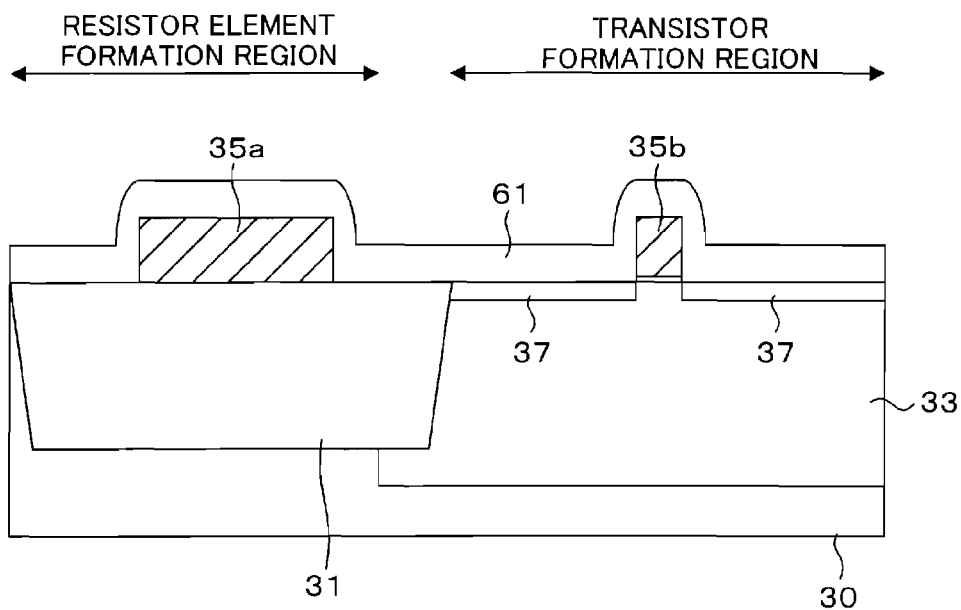

Next, as illustrated in FIG. 3C, an ashing process is performed to remove the photoresist film 62. Note that, the temperature of the substrate during the ashing process is set between 80° C. to 400° C. (preferably equal to or less than 150° C.), for example.

Thereafter, the surface of the substrate where the photoresist film 62 has been attached is wet-cleaned by a sulfuric acid aqueous solution or the like. At this time, the polysilicon gate 35b and the extension regions 37 are covered with the insulating film 61 in this embodiment. Thus, damage to the polysilicon gate 35b and the surfaces of the substrate (the extension regions 37) is avoided. In addition, even if the conductive impurity ion-implanted into the insulating film 61 on the resistor element formation region reacts with O and H in the atmosphere and thus generates acid, dissolution of the polysilicon gate 35b and the extension regions 37 by the acid is avoided. Thus, degradation of the transistor characteristics is avoided.

Figure 3D:
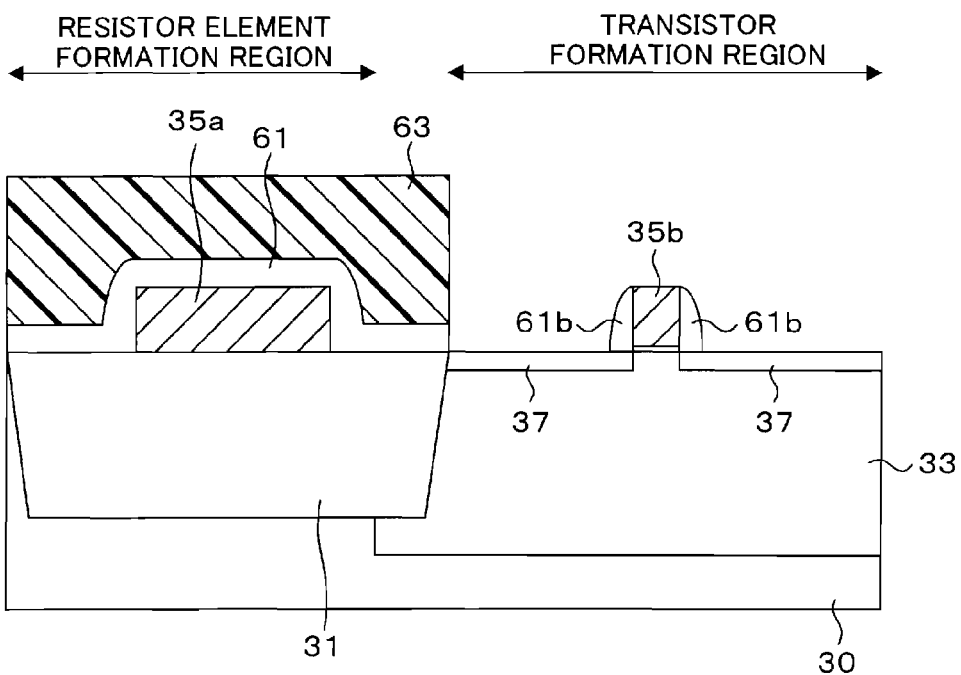

Next, as illustrated in FIG. 3D, a photoresist film 63 is formed to cover the resistor element formation region. Then, the insulating film 61 on the transistor formation region is etched back to form sidewalls 61b on both sides of the polysilicon gate 35b. Thereafter, the photoresist film 63 is removed.

Figure 3E:
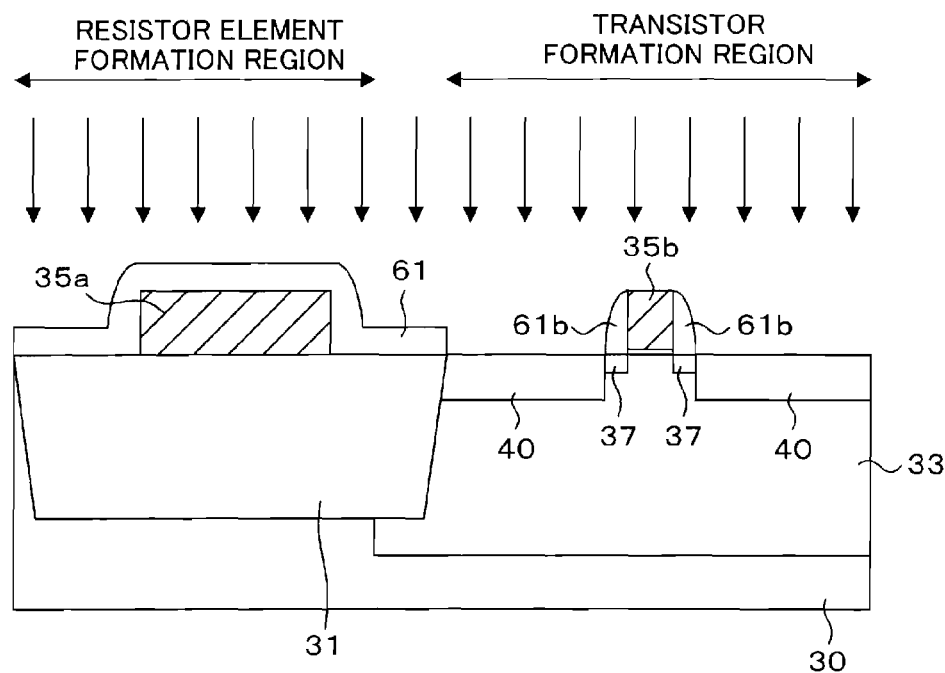

Next, as illustrated in FIG. 3E, an n-type conductive impurity is ion-implanted into the polysilicon film 35a under a condition that the conductive impurity penetrates through the insulating film 61. At the same time, the n-type conductive impurity is ion-implanted into the polysilicon gate 35b and the p-well 33 of the transistor formation region in a highly concentrated manner. Here, As (arsenic) and P (phosphorus) are ion-implanted into the polysilicon film 35a, the polysilicon gate 35b and the p-well 33. As is ion-implanted under the conditions that the acceleration energy is 20 keV and the dose amount is $4.0 \times 10^{15}$ cm$^{-2}$, for example. In addition, P is ion-implanted under the conditions that the acceleration energy is 10 keV and the dose amount is $5.0 \times 10^{14}$ cm$^{-2}$, for example.

The ion-implantation of the n-type conductive impurity causes a decrease in the resistance values of the polysilicon film 35a and the polysilicon gate 35b, and also forms n-type high concentration impurity regions 40 to be a source and a drain on surfaces of the substrate on both sides of the polysilicon gate 35b.

Note that, a region of each of the extension regions 37 except for a portion below a corresponding one of the sidewalls 61b becomes the n-type high concentration impurity region 40. After the ion-implantation of the n-type conductive impurity, annealing is performed at a temperature of 1025° C., for example, and the ion-implanted conductive impurity is activated.

In this embodiment, in the step of FIG. 3E, the n-type conductive impurity is implanted into the transistor formation region while the n-type conductive impurity is also implanted into the polysilicon film 35a on the resistor element formation region. However, the resistor element formation region may be covered by a resist mask during this step, for example, and thus the n-type conductive impurity may be selectively implanted into the transistor formation region.

Figure 3F:
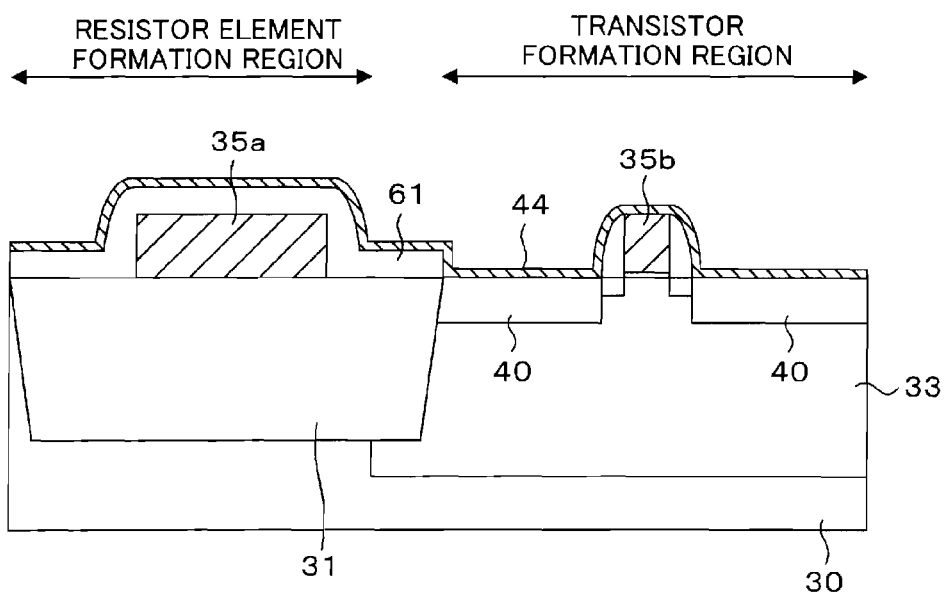
Figure 3G:
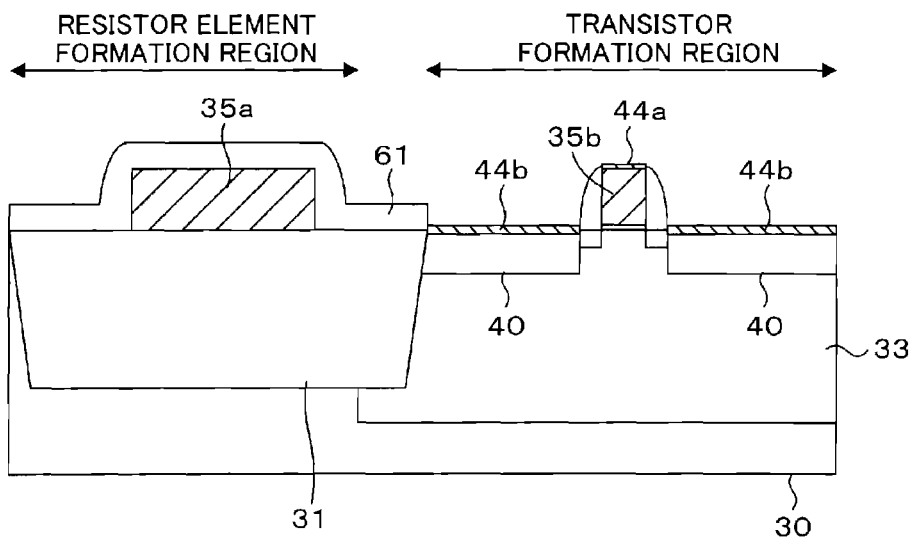

Next, as illustrated in FIG. 3F, a Co film 44 is formed on the entire upper surface of the semiconductor substrate 30 with a thickness of 4 nm, for example, and a TiN film is further formed as a cap layer (not illustrated) on the Co film 44 with a thickness of 30 nm. Thereafter, the substrate is kept in a nitrogen ($N_2$) atmosphere for 30 seconds at a temperature of 520° C., for example, to cause Co and silicon to react with each other. Thereafter, the Co film 44 and the cap layer are removed. Thus, a silicide film 44a is formed on the polysilicon gate 35b and silicide films 44b are formed on the high concentration impurity regions 40 as illustrated in FIG. 3G. Thereafter, annealing is performed in a nitrogen atmosphere for 30 seconds at a temperature of 700° C., for example.

Figure 3H:
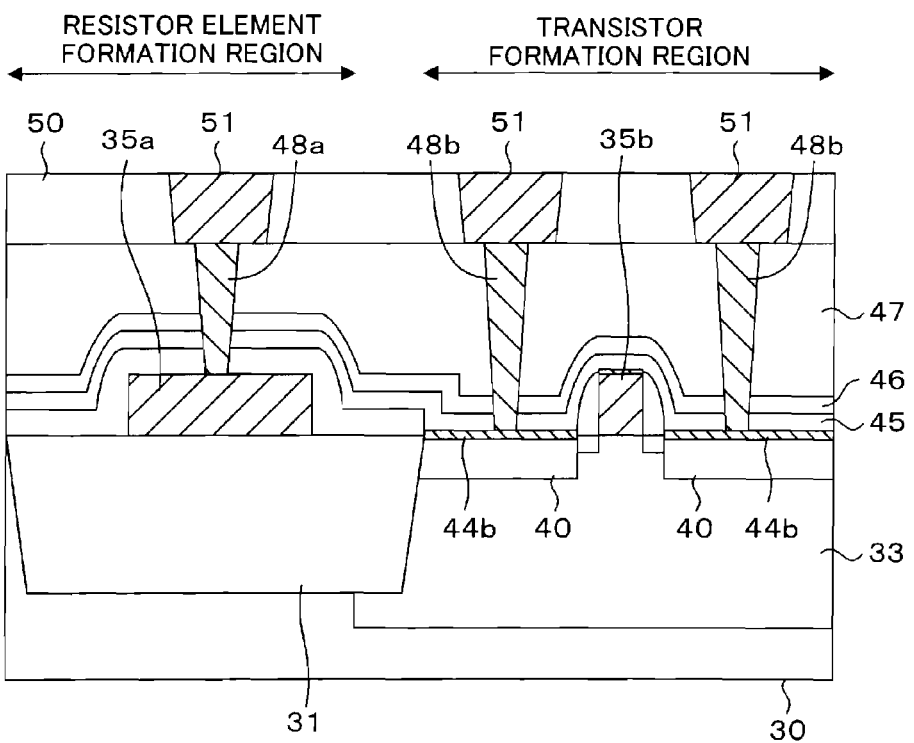

Next, as illustrated in FIG. 3H, a SiN film 45, a $SiO_2$ film 46, a $SiO_2$ film 47, plugs 48a and 48b, a $SiO_2$ film 50, wiring 51 and the like are formed in the same manner as the first embodiment. Accordingly, a semiconductor device having a polysilicon resistor element and a MOS transistor of an LDD structure is completed.

In this embodiment, the polysilicon gate 35b and the extension regions 37 are covered with the insulating film 61 when the photoresist film 62 is removed by an ashing process, as described above (refer to FIGS. 3B and 3C). Thus, damage to the polysilicon gate 35b and the extension regions 37 due to the ashing process is avoided. In addition, even if the conductive impurity ion-implanted into the insulating film 61 on the resistor element formation region reacts with O and H in the atmosphere and thus generates acid, dissolution of the polysilicon gate 35b and the extension regions 37 by the acid is avoided. Thus, a transistor having good characteristics may be obtained.

Furthermore, in this embodiment, since the insulating film 61 covers the polysilicon film 35a into which the conductive impurity is implanted, there is an effect to avoid out-diffusion which is a phenomenon that the conductive impurity is diffused from the polysilicon film 35a (resistor element), thus, causing a change in the resistance value.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a semiconductor device, comprising:
    forming a first insulating film in a resistor element formation region of a semiconductor substrate;
    forming a gate insulating film in a transistor formation region of the semiconductor substrate;
    forming a semiconductor film above the first insulating film while forming a gate made of semiconductor above the gate insulating film;
    forming impurity regions by ion-implanting a conductive impurity into the transistor formation region of the semiconductor substrate with the gate used as a mask, the impurity regions formed to be a source and a drain;
    forming a second insulating film covering the semiconductor film, the impurity regions and the gate;
    forming a resist film above the second insulating film in the transistor formation region;
    ion-implanting a conductive impurity into the semiconductor film with the resist film used as a mask under a condition that the conductive impurity penetrates through the second insulating film in the resistor element formation region;
    removing the resist film by ashing; and
    removing the second insulating film in the transistor formation region while leaving the second insulating film in the resistor element formation region.

2. The method of manufacturing a semiconductor device according to claim 1, wherein the conductive impurity implanted into the semiconductor film is P (phosphorus).

3. The method of manufacturing a semiconductor device according to claim 2, wherein a dose amount of P implanted into the semiconductor film is equal to or greater than $5.0 \times 10^{15}$ cm$^{-2}$.

4. The method of manufacturing a semiconductor device according to claim 1, wherein a concentration of the conductive impurity implanted into the semiconductor film is higher than a concentration of the impurity implanted into the impurity regions.

5. The method of manufacturing a semiconductor device according to claim 1, further comprising, forming silicide films on the impurity regions and the gate after the removing the second insulating film.

6. The method of manufacturing a semiconductor device according to claim 1, wherein the semiconductor film and the gate are made of polysilicon.

7. A method of manufacturing a semiconductor device, comprising:
    forming a first insulating film in a resistor element formation region of a semiconductor substrate;
    forming a gate insulating film in a transistor formation region of the semiconductor substrate;
    forming a semiconductor film above the first insulating film while forming a gate made of semiconductor above the gate insulating film;
    forming a second insulating film covering the semiconductor film on the resistor element formation region and covering the surface of the substrate and the gate in the transistor formation region;
    forming a first resist film on the second insulating film in the transistor formation region;
    ion-implanting a conductive impurity into the semiconductor film with the first resist film used as a mask under a condition that the conductive impurity penetrates through the second insulating film;
    removing the first resist film by ashing;
    forming a second resist film on the second insulating film in the resistor element formation region;
    forming a sidewall on a side portion of the gate by etching back the second insulating film in the transistor formation region;
    removing the second resist film; and
    forming impurity regions by ion-implanting a conductive impurity into the transistor formation region of the semiconductor substrate with the gate and the sidewall used as masks, the impurity regions formed to be a source and a drain.

8. The method of manufacturing a semiconductor device according to claim 7, wherein the conductive impurity implanted into the semiconductor film is P (phosphorus).

9. The method of manufacturing a semiconductor device according to claim 8, wherein a dose amount of P is equal to or greater than $5.0 \times 10^{15}$ cm$^{-2}$.

10. The method of manufacturing a semiconductor device according to claim 7, wherein a concentration of the conductive impurity implanted into the semiconductor film is higher than a concentration of the impurity implanted into the impurity regions.

11. The method of manufacturing a semiconductor device according to claim 7, further comprising, forming silicide films on the impurity regions and the gate.

12. The method of manufacturing a semiconductor device according to claim 7, wherein the semiconductor film and the gate are made of polysilicon.

* * * * *